United States Patent
Ho et al.

(10) Patent No.: US 9,277,640 B2
(45) Date of Patent: Mar. 1, 2016

(54) FLEXIBLE PRINTED CIRCUIT BOARD AND METHOD FOR MANUFACTURING SAME

(71) Applicants: FuKui Precision Component (Shenzhen) Co., Ltd., Shenzhen (CN); Zhen Ding Technology Co., Ltd., Tayuan, Taoyuan (TW)

(72) Inventors: Ming-Jaan Ho, New Taipei (TW); Xian-Qin Hu, Shenzhen (CN); Fu-Yun Shen, Shenzhen (CN); Yi-Qiang Zhuang, Shenzhen (CN)

(73) Assignees: FuKui Precison Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 0 days.

(21) Appl. No.: 14/586,986

(22) Filed: Dec. 31, 2014

(65) Prior Publication Data

US 2015/0189738 A1 Jul. 2, 2015

(30) Foreign Application Priority Data

Dec. 31, 2013 (CN) .......................... 2013 1 0747914

(51) Int. Cl.
*H05K 1/02* (2006.01)
*H05K 1/11* (2006.01)
*H05K 3/00* (2006.01)
*H05K 1/03* (2006.01)

(52) U.S. Cl.
CPC ............ *H05K 1/0218* (2013.01); *H05K 1/0219* (2013.01); *H05K 1/0393* (2013.01); *H05K 2201/0715* (2013.01); *H05K 2201/09509* (2013.01); *Y10T 156/1057* (2015.01)

(58) Field of Classification Search
CPC . H05K 1/0218; H05K 1/0219; H05K 1/0393; H05K 2201/0715; H05K 2201/09509; Y10T 156/1057
See application file for complete search history.

(56) References Cited

U.S. PATENT DOCUMENTS

| | | | |
|---|---|---|---|
| 2011/0094776 A1* | 4/2011 | Lee | H05K 3/4644 174/254 |
| 2014/0158412 A1* | 6/2014 | Kido | C08L 63/00 174/254 |

FOREIGN PATENT DOCUMENTS

| | | |
|---|---|---|
| JP | 2011-159819 A | 8/2011 |
| TW | M447663 U1 | 2/2013 |

* cited by examiner

*Primary Examiner* — Whitney T Moore
(74) *Attorney, Agent, or Firm* — Novak Druce Connolly Bove + Quigg LLP

(57) ABSTRACT

A flexible printed circuit board includes a flexible printed circuit unit and an electromagnetic shielding structure. The flexible printed circuit unit includes a base layer and a first circuit layer formed on a surface of the base layer. The electromagnetic shielding structure includes a first insulating layer and a copper layer. The first insulating layer is adhered on a surface of the first circuit layer away from the base layer. At least one blind hole is defined in the electromagnetic shielding structure. The copper layer is electrically connected to the first circuit layer by a plating structure filled in the blind hole.

8 Claims, 9 Drawing Sheets

FLEXIBLE PRINTED CIRCUIT BOARD AND METHOD FOR MANUFACTURING SAME

FIELD

The subject matter herein generally relates to a flexible printed circuit board and a method for manufacturing same.

BACKGROUND

At present, a flexible printed circuit board usually includes an electromagnetic shielding film. The electromagnetic shielding film is adhered on a surface of a cover layer of the flexible printed circuit board and electrically connects a circuit layer of the flexible printed circuit board. The electromagnetic shielding film is configured to provide a electromagnetic shielding to circuit layers of the flexible printed circuit board.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
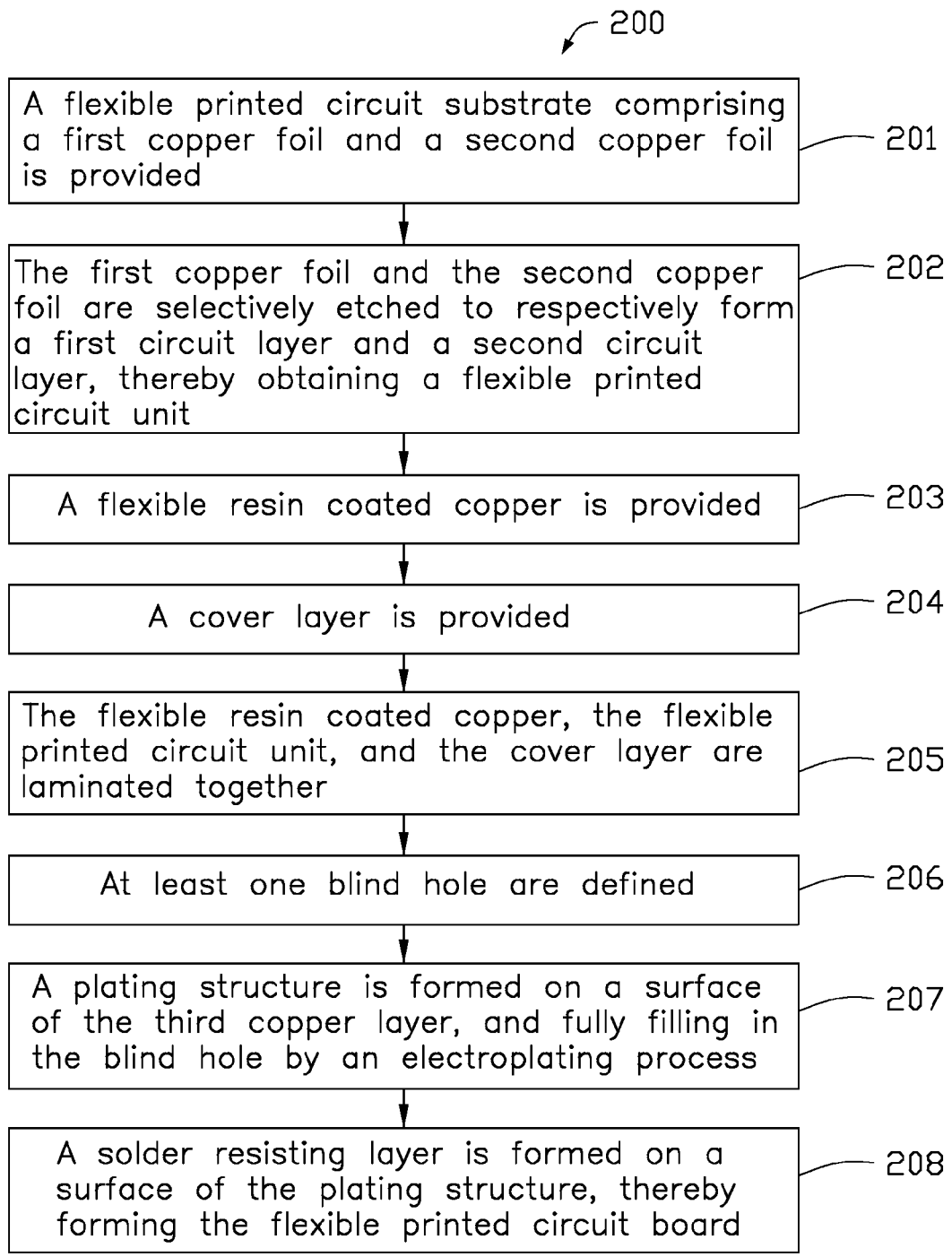
FIG. 1 is a flowchart of a method for manufacturing a flexible printed circuit board of an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "comprising," when utilized, means "including, but not necessarily limited to"; it specifically indicates open-ended inclusion or membership in the so-described combination, group, series and the like. The references "a plurality of" and "a number of" mean "at least two."

The present disclosure is described in relation to a flexible printed circuit board. The flexible printed circuit board includes a flexible printed circuit unit and an electromagnetic shielding structure. The flexible printed circuit unit includes a base layer and a first circuit layer formed on a surface of the base layer. The electromagnetic shielding structure includes a first insulating layer and a copper layer. The first insulating layer is adhered on a surface of the first circuit layer away from the base layer. At least one blind hole is defined in the electromagnetic shielding structure. The copper layer is electrically connected to the first circuit layer by a plating structure filled in the blind hole.

The present disclosure is described in relation to a method for manufacturing a flexible printed circuit board. The method includes providing a flexible printed circuit unit comprising a base layer and a first circuit layer formed on a surface of the base layer; providing a flexible resin coated copper, the flexible resin coated copper including a first insulating layer and a copper layer adhered with the first insulating layer; adhering the flexible resin coated copper with the flexible printed circuit unit, the first insulating layer is adhered on a surface of the first circuit layer away from the base layer; defining at least one blind hole in the flexible resin coated copper, the blind hole passes through the copper layer and the first insulating layer, a portion of the first circuit layer is exposed from the blind hole; and filling a plating structure in the blind hole, the copper layer is electrically connected to the first circuit layer by a plating structure filled in the blind hole, the first insulating layer, the copper layer and the plating structure forms an electromagnetic shielding structure.

Referring to FIG. 1, a flowchart of an example method 200 for manufacturing a flexible printed circuit board is presented in accordance with an example embodiment. The example method 200 is provided by way of example, as there are a variety of ways to carry out the method. Each block shown in FIG. 1 represents one or more processes, methods, or subroutines, carried out in the exemplary method 200. Additionally, the illustrated order of blocks is by example only and the order of the blocks can change. The exemplary method 200 can begin at block 201.

At block 201, a flexible printed circuit substrate comprising a first copper foil and a second copper foil is provided.

At block 202, the first copper foil and the second copper foil are selectively etched to respectively form a first circuit layer and a second circuit layer, thereby obtaining a flexible printed circuit unit.

At block 203, a flexible resin coated copper comprising a third copper layer is provided.

At block 204, a cover layer is provided.

At block 205, the flexible resin coated copper, the flexible printed circuit unit, and the cover layer are laminated together.

At block 206, at least one blind hole are defined.

At block 207, a plating structure is formed on a surface of the third copper layer, and fully filling in the blind hole by an electroplating process.

At block 208, a solder resisting layer is formed on a surface of the plating structure, thereby forming the flexible printed circuit board.

FIGS. 2-8 illustrates the method 200 for manufacturing the flexible printed circuit board.

Figure 2:
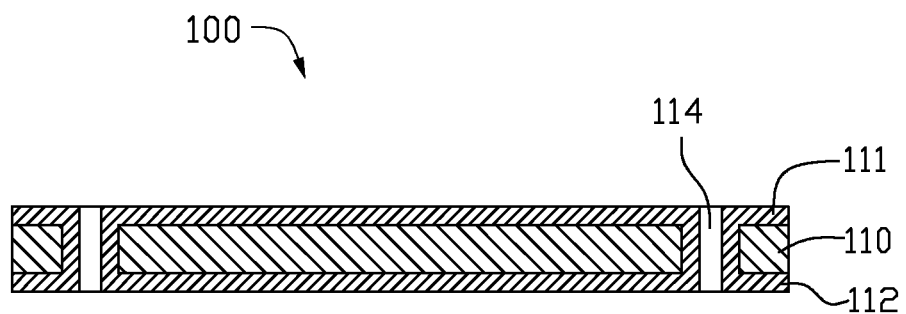
FIG. 2 is a cross-sectional view of a flexible printed circuit substrate including two copper foils.

A flexible printed circuit substrate 100 is provided, as shown in FIG. 2. The flexible printed circuit substrate 100 includes a base layer 110, a first copper layer 111 and a second copper layer 112 respectively arranged on opposite sides of the base layer 110. The flexible circuit substrate 100 includes at least one conductive through hole 114 electrically connecting the first copper layer 113 and the second copper layer 112. The base layer 110 can be a flexible resin layer, such as polyimide, polyethylene terephthalate or Polythylene Naphthalate. The base layer 110 can also be a multilayer printed circuit substrate.

Figure 3:
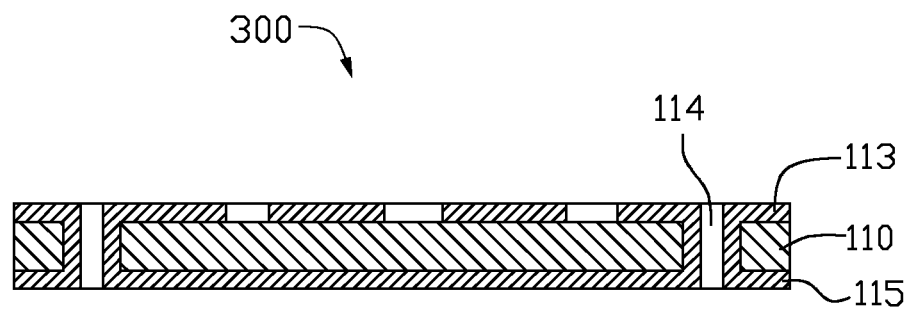
FIG. 3 illustrates that the copper foils of the flexible printed circuit substrate of FIG. 2 are etched to circuit layers.

The first copper foil 111 and the second copper foil 112 are selectively etched to respectively form a first circuit layer 113 and a second circuit layer 115, thereby obtaining a flexible printed circuit unit 300, as shown in FIG. 3.

Figure 4:
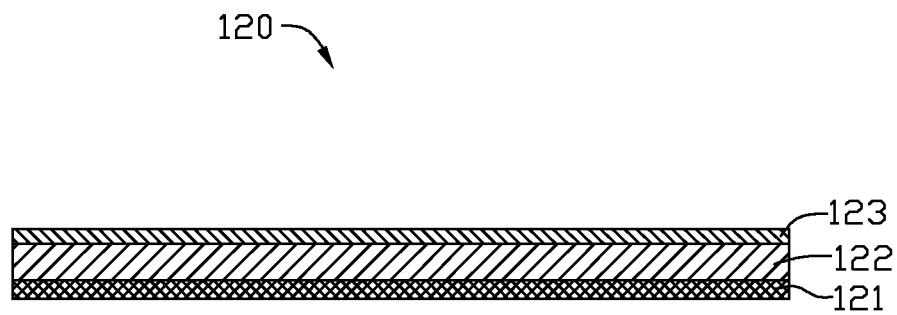
FIG. 4 is a cross-sectional view of a flexible resin coated copper.

A flexible resin coated copper 120 is provided, as shown in FIG. 4. The flexible resin coated copper 120 includes a first adhesive layer 121, a first insulating layer 122, and a third copper layer 123 adhered in the described order. The first insulating layer 122 can be a flexible resin layer, such as polyimide, polyethylene terephthalate or Polythylene Naphthalate.

Figure 5:
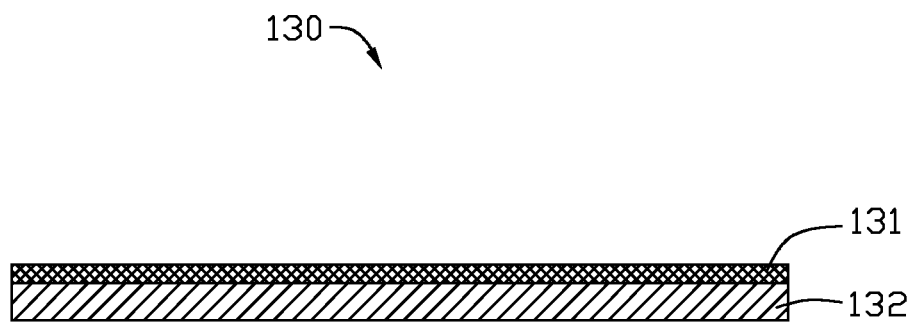
FIG. 5 is a cross-sectional view of a cover layer.

A cover layer 130 is provided, as shown in FIG. 5. The cover layer 130 includes a second adhesive layer 131 and a second insulating layer 132 adhered with the second adhesive layer 131. The second insulating layer 130 can be a flexible resin layer, such as polyimide, polyethylene terephthalate or Polythylene Naphthalate.

Figure 6:
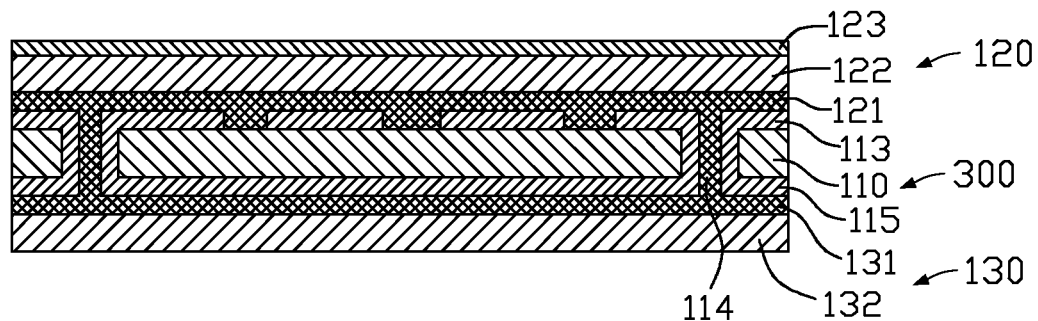
FIG. 6 illustrates that the flexible resin coated copper in FIG. 4, the cover layer in FIG. 5 and the flexible printed circuit substrate in FIG. 3 are laminated together.

The flexible resin coated copper 120, the flexible printed circuit unit 300, and the cover layer 130 are laminated together, as shown in FIG. 6. The first adhesive layer 121 is bonded on a surface of the first circuit layer 113, away from the base layer 110. The second adhesive layer 131 is bonded on a surface of the second circuit layer 115 away from the base layer 110. The first adhesive layer 121 and the second adhesive layer 131 fully fill the conductive through hole 114.

Figure 7:
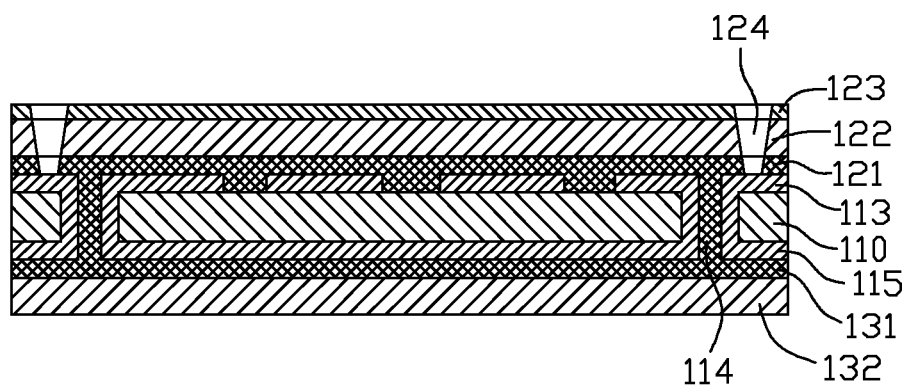
FIG. 7 illustrates that blind holes are formed in the laminated flexible resin coated copper of FIG. 6.

At least one blind hole 124 are defined to pass through the third copper layer 123, the first insulating layer 122, and the first adhesive layer 121, and at least one portions of the first circuit layer 113 are exposed from the at least one blind holes 124, as shown in FIG. 7. In this embodiment, the blind hole 124 is formed by a laser drilling process.

Figure 8:
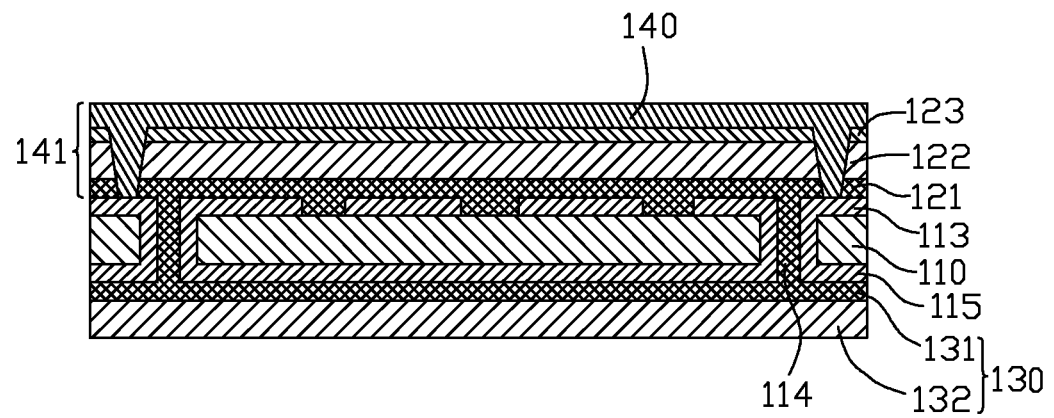
FIG. 8 illustrates that a plating structure is formed on a surface of the flexible resin coated copper of FIG. 7, and fills the blind holes of FIG. 7.

A plating structure 140 is formed on a surface of the third copper layer 123 away from the first insulating layer 122, and fully filling in the blind hole 124 by an electroplating process, as shown in FIG. 8. In this embodiment, the plating structure 140, the third copper layer 123, the first insulating layer 122 and the first adhesive layer 121 forms an electromagnetic shielding structure 141. The plating structure 140 arranged on the surface of the third copper layer 123 and the third copper layer 123 are electrically connected to the first circuit layer 113 by the plating structure 140 filling in the blind hole 124. In other embodiments, the plating structure 140 formed on a surface of the third copper layer 123 away from the first insulating layer 122 can be omitted.

Figure 9:
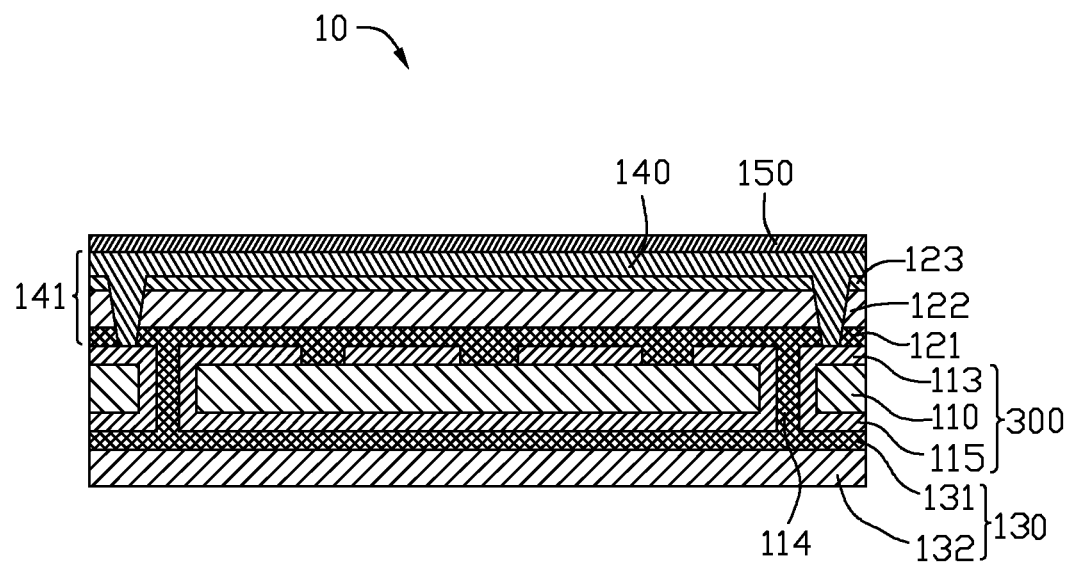
FIG. 9 illustrates that a solder layer is formed on a surface of the plating structure of FIG. 8.

A solder resisting layer 150 is formed on a surface of the plating structure 140 away from the first insulating layer 122, thereby forming a flexible printed circuit board 10, as shown in FIG. 9. The solder resisting layer 150 is configured to protect the electromagnetic shielding structure 141.

As FIG. 9 illustrated, the flexible printed circuit board 10 manufacturing by the method 200 includes a flexible printed circuit unit 300, an electromagnetic shielding structure 141, a solder resisting layer 150, and a cover layer 130.

The flexible printed circuit unit 300 includes a base layer 110, a first circuit layer 113 and a second circuit layer 115 respectively arranged on opposite sides of the base layer 110. The flexible printed circuit unit 300 also includes at least one conductive through hole 114 passing through the first circuit layer 113, the base layer 110 and the second circuit layer 115, and electrical connecting the circuit layer 113 and the second circuit layer 115.

The electromagnetic shielding structure 141 includes a first adhesive layer 121, a first insulating layer 122, a third copper layer 123 and a plating structure 140 arranged in the described order. The electromagnetic shielding structure 141 arranged on a surface of the first circuit layer 113 away from the base layer 110, and the first adhesive layer 121 is directly bonded to the first circuit layer 113. The electromagnetic shielding structure 141 defined at least one blind hole 124 passing through the first adhesive layer 121, the first insulating layer 122, and the third copper layer 123. The blind hole 124 is filled in with the plating structure 140. The third copper layer 123, and the plating structure 140 on the surface of the third copper layer 123 are electrically connected to the first circuit layer 113 by the plating structure 140 filled in the blind hole 124.

The cover layer 130 includes a second adhesive layer 131 and a second insulating layer 132. The cover layer 130 is arranged on a surface of the second circuit layer 115 away from the base layer 110. The second adhesive layer 131 is directly bonded to the second circuit layer 115. The first adhesive layer 121 and the second adhesive layer 131 are merging into the conductive through hole 114.

The solder resisting layer 150 is formed on a surface of the plating structure 140 away from the first insulating layer 122.

The embodiments shown and described above are only examples. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method for manufacturing a flexible printed circuit board, comprising:
    providing a flexible printed circuit unit comprising a base layer and a first circuit layer formed on a surface of the base layer;
    providing a flexible resin coated copper, the flexible resin coated copper comprising a first insulating layer and a copper layer adhered with the first insulating layer;
    adhering the flexible resin coated copper with the flexible printed circuit unit, the first insulating layer being adhered on a surface of the first circuit layer away from the base layer;
    defining at least one blind holes in the flexible resin coated copper, the blind hole passing through the copper layer and the first insulating layer, a portion of the first circuit layer being exposed from the blind hole; and
    filling a plating structure in the blind hole, the copper layer being electrically connected to the first circuit layer by the plating structure filled in the blind hole, thereby forming a flexible printed circuit board;

wherein the first insulating layer, the copper layer and the plating structure forming an electromagnetic shielding structure.

2. The method of claim 1, wherein the flexible printed circuit unit further comprises a second circuit layer arranged on a surface of the base layer away from the first circuit layer.

3. The method of claim 2, wherein the flexible circuit unit comprises at least one conductive through hole electrically connecting the first circuit layer and the second circuit layer.

4. The method of claim 3, after forming the plating structure, further comprising forming a cover layer on a surface of the second circuit layer, the cover layer having a second insulating layer adhered to the second circuit layer.

5. The method of claim 1, wherein the base layer is made of flexible resin.

6. The method of claim 1, wherein the base layer is a multilayer printed circuit substrate.

7. The method of claim 1, wherein the plating structure further forms on a surface of the copper layer away from the first insulating layer, the copper layer, and the plating structure on the surface of the copper layer are electrically connected to the first circuit layer by the plating structure filled in the blind hole.

8. The method of claim 7, after forming the plating structure, further comprising forming a solder layer on a surface of the plating structure away from the base layer.

* * * * *